(12) United States Patent
LaDuca et al.

(10) Patent No.: US 10,352,541 B2
(45) Date of Patent: Jul. 16, 2019

(54) INTEGRATED SMART MODULE ARCHITECTURE

(71) Applicant: SIGNIFY HOLDING B.V., Eindhoven (NL)

(72) Inventors: Robert LaDuca, Union City, CA (US); Howard Herrera, Carlsbad, CA (US)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/011,479

(22) Filed: Jan. 29, 2016

(65) Prior Publication Data

US 2016/0223179 A1 Aug. 4, 2016

Related U.S. Application Data

(60) Provisional application No. 62/110,432, filed on Jan. 30, 2015.

(51) Int. Cl.
| | |
|---|---|
| *F21V 29/00* | (2015.01) |
| *F21V 23/00* | (2015.01) |
| *F21V 15/01* | (2006.01) |
| *F21Y 105/10* | (2016.01) |
| *F21Y 115/10* | (2016.01) |
| *H05K 1/18* | (2006.01) |

(52) U.S. Cl.
CPC ............ *F21V 23/005* (2013.01); *F21V 15/01* (2013.01); *F21Y 2105/10* (2016.08); *F21Y 2115/10* (2016.08); *H05K 1/18* (2013.01); *H05K 2201/09072* (2013.01); *H05K 2201/10106* (2013.01)

(58) Field of Classification Search
USPC .......................................................... 362/294
See application file for complete search history.

(56) References Cited

U.S. PATENT DOCUMENTS

| | | | | |
|---|---|---|---|---|
| 7,741,782 | B2* | 6/2010 | Vermeulen | ................ F21V 3/04 315/156 |
| 2002/0176250 | A1* | 11/2002 | Bohler | .................... F21V 29/74 362/236 |
| 2007/0247824 | A1* | 10/2007 | Brazis | .................... H05K 1/118 361/784 |
| 2009/0303713 | A1 | 12/2009 | Chang et al. | |
| 2010/0097799 | A1 | 4/2010 | Shin | |
| 2010/0308350 | A1* | 12/2010 | Bisberg | ................... H01L 33/58 257/88 |
| 2011/0090691 | A1* | 4/2011 | Markle | ..................... F21K 9/00 362/249.02 |

(Continued)

OTHER PUBLICATIONS

Non-Final Office Action for U.S. Appl. No. 14/964,442, dated Jan. 27, 2017 (5 pages).

(Continued)

*Primary Examiner* — Tuyen K Vo
(74) *Attorney, Agent, or Firm* — Stephen M. Kohen

(57) ABSTRACT

Some embodiments of the invention comprise a lighting assembly comprising including a substrate including a first side, a second side and an opening. The lighting assembly includes several electronic components disposed on the first side of the substrate. The lighting assembly includes a light emitting element attached to the substrate on the first side and positioned within the opening of the substrate.

13 Claims, 8 Drawing Sheets

(56) References Cited

U.S. PATENT DOCUMENTS

| | | | |
|---|---|---|---|
| 2013/0044501 A1* | 2/2013 | Rudisill | F21V 29/70 |
| | | | 362/398 |
| 2013/0250586 A1* | 9/2013 | Sasaki | F21V 29/20 |
| | | | 362/373 |
| 2013/0301267 A1* | 11/2013 | Badley | F21V 19/00 |
| | | | 362/249.1 |
| 2014/0092582 A1 | 4/2014 | Keser et al. | |
| 2014/0254167 A1* | 9/2014 | Kennedy | F21V 7/041 |
| | | | 362/294 |
| 2014/0369053 A1 | 12/2014 | Ting et al. | |
| 2015/0338081 A1 | 11/2015 | McGowan et al. | |
| 2016/0178181 A1 | 6/2016 | LaDuca | |
| 2016/0341372 A1 | 11/2016 | Shim | |

OTHER PUBLICATIONS

Non-Final Office Action for U.S. Appl. No. 14/964,422, dated Sep. 20, 2017 (5 pages).

Final Office Action for U.S. Appl. No. 14/964,422, dated Mar. 27, 2018.

U.S. Non-Final Office Action for U.S. Appl. No. 14/964,422, dated Sep. 7, 2018 (6 pages).

* cited by examiner

INTEGRATED SMART MODULE ARCHITECTURE

CROSS REFERENCE TO RELATED APPLICATIONS

This application claims the benefit of U.S. Provisional Patent Application No. 62/110,432 entitled "INTEGRATED SMART MODULE ARCHITECTURE" which was filed on Jan. 30, 2015, the entirety of which is herein incorporated by reference.

BACKGROUND OF THE INVENTION

Field of the Invention

The present invention generally relates to modular lighting assemblies and more particularly to smart lighting assemblies incorporating light emitting diodes (LED) and electronic components.

Background

Current lighting assemblies typically include electronic components that are disposed on a substrate and on the same side as the light emitting element. Such architectures are problematic because the electrical components can cause optical interference with the light emitted from the light emitting element. Additionally such architectures cannot be securely mounted to third party components such as optical elements or heat sinks.

Therefore it is difficult to design a lighting assembly that is adaptable to securely incorporate variable optical configurations without interfering with the electronics.

SUMMARY OF THE INVENTION

Accordingly, embodiments are directed to techniques and systems that can be used to securely incorporate variable optical configurations into smart lighting modules without interfering with the electronics.

Some embodiments of the invention comprise a lighting assembly including a substrate, a first side, a second side and an opening. The lighting assembly includes several electronic components disposed on the first side of the substrate. The lighting assembly includes a light emitting element attached to the substrate on the first side and positioned within the opening of the substrate.

Some embodiments of the invention comprise a lighting assembly including a substrate and an opening. The lighting assembly includes a light emitting element attached to the substrate and positioned within the opening of the substrate. The lighting assembly includes a housing configured to thermally couple to the light emitting element.

Some embodiments of the invention comprise a lighting assembly including a substrate, an opening and an electrical contact. The lighting assembly includes several electronic components attached to the substrate and electrically coupled to the contact. The lighting assembly includes a light emitting element comprising an electrical pad. The light emitting element is arranged within the opening and attached to the substrate with the pad electrically coupled to the contact on the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
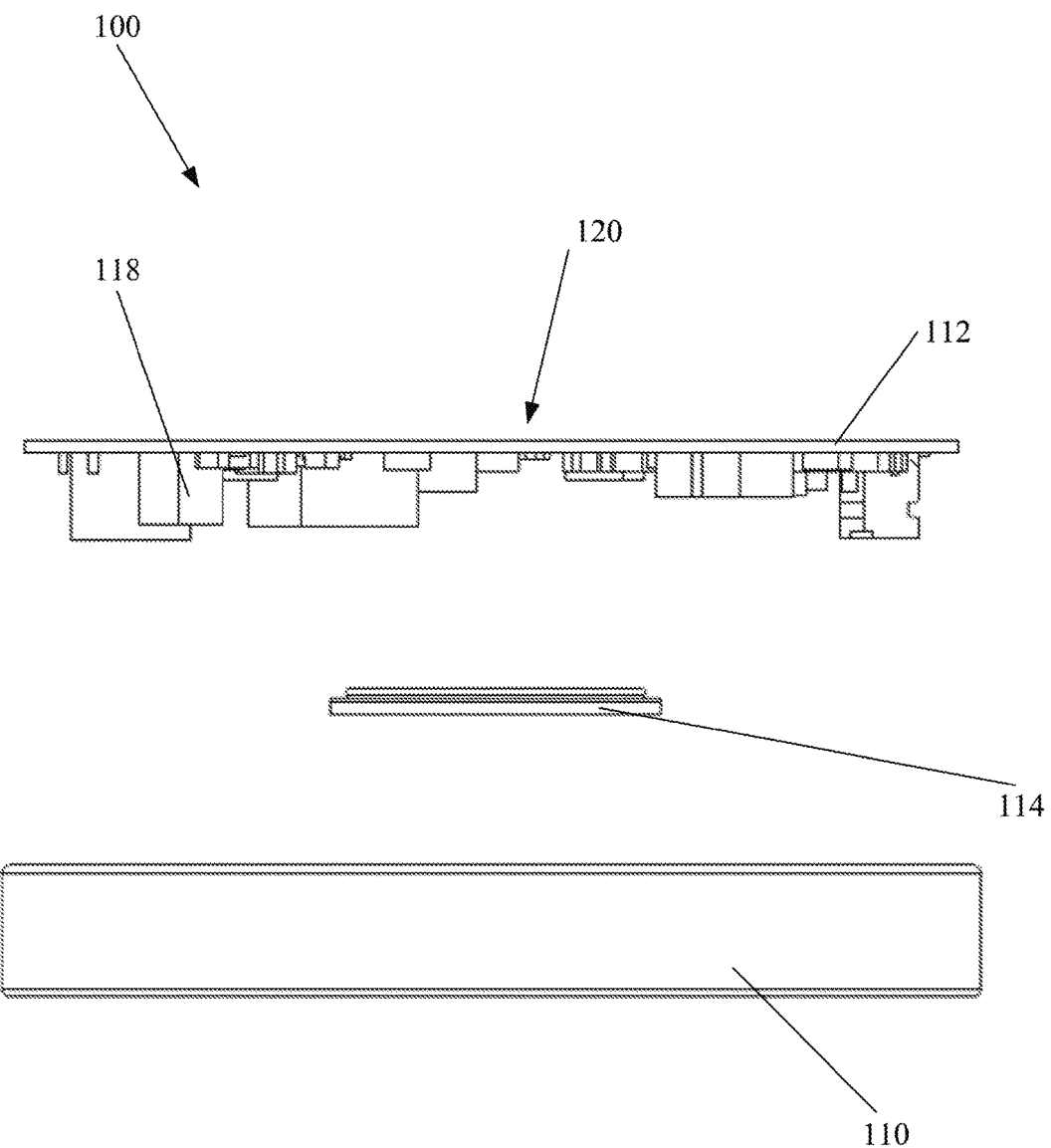
FIG. 1 is an exploded view of an embodiment of the lighting assembly.

Various aspects of the invention will be described herein with reference to drawings that are schematic illustrations of idealized configurations of the present invention. As such, variations from the shapes of the illustrations resulting from manufacturing techniques, tolerances, etc., are to be expected. Thus, the various aspects of the invention presented throughout this disclosure should not be construed as limited to the particular shapes of elements (e.g., regions, layers, sections, substrates, etc.) illustrated and described herein, but are to include deviations in shapes that result, for example, from manufacturing. By way of example, an element illustrated or described as a rectangle may have rounded or curved features and/or a gradient concentration at its edges rather than a discrete change from one element to another.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements disclosed as being on the "lower" side of other elements would then be oriented on the "upper" side of the other elements. The term "lower" can therefore encompass both an orientation of "lower" and "upper," depending on the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

Furthermore, various descriptive terms used herein, such as "on" should be given the broadest meaning possible within the context of the present disclosure. It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present.

Some embodiments of a lighting assembly comprise a flipped substrate board design that provides a flat and open space on the top surface of the lighting assembly for reduced optical interference. Some embodiments of the lighting assembly also allow hot components to be thermally bonded to the substrate when the substrate is flipped so the components are facing away from the light emitting element. In such examples, a flat and open area is provided on the surface of the lighting assembly for an optical element to interface with while still thermally sinking the LED substrate to an external heat sink through a housing.

FIG. 1 illustrates an exploded view of an embodiment of the lighting assembly. As shown, FIG. 1 illustrates a deconstructed lighting assembly 100 that includes a housing 110, a substrate 112, a light emitting element 114, electronic components 118, and an opening 120 in the substrate 112. Although not illustrated, the opening 120 may be a circular hole positioned in the center of the substrate. As will be described with respect to the foregoing figures, an assembled lighting assembly comprises the housing 110, the substrate 112, the light emitting element 114, the electronic components 118, and the opening 120 in a single enclosed unit. The substrate 112 may comprise a first side, a second side and the opening 120. In such embodiments, the electronic components 118 are disposed on the first side of the substrate and a light emitting element 114 is attached to the substrate on the first side, positioned within the opening of the substrate. In some embodiments of the lighting assembly, the electronic components in the enclosure may be potted. The second side of the substrate is configured to attach to an optical element for directing light emitted from the light emitting element 114. The optical element may also attach to the housing in a manner, which will be discussed in the foregoing figures.

The housing 110 may be made of a rigid material. Such material may include aluminum or metal. However, one of ordinary skill in the art will appreciate that any suitable rigid material may be used without departing from the scope of the invention. The light emitting element 114 may be thermally coupled to the housing 110 by way of a protrusion (not shown) that extends up from within the housing 110 to support the light emitting element 114. When assembled, the light emitting element 114 may be soldered to the first side of substrate 112 in order to bond the light emitting element 114 to the substrate 112 and form an electrical connection between the light emitting element 114 and the substrate 112. The substrate 112 with the bonded light emitting element 114 is the arranged with the housing 110 to form the enclosure. The light emitting element is rigidly and/or securely fastened to the enclosure. At the same time, a thermal connection is formed between the light emitting element 114 and the protrusion.

The second side of the substrate may comprise a reflective surface and may include a means for attaching an optical component. For example, the means may be holes on the substrate 112 that align to holes in the housing 110. Additionally, the housing 110 can also be configured to attach to a heat sink. Alternatively or conjunctively, the lighting assembly may include a thermal conductor configured to directly couple at least one of the electronic components to the housing 110 in order to dissipate heat from the at least one electronic component. Such thermal conductors will be discussed in greater detail with respect to FIGS. 5 and 6.

Figure 2:
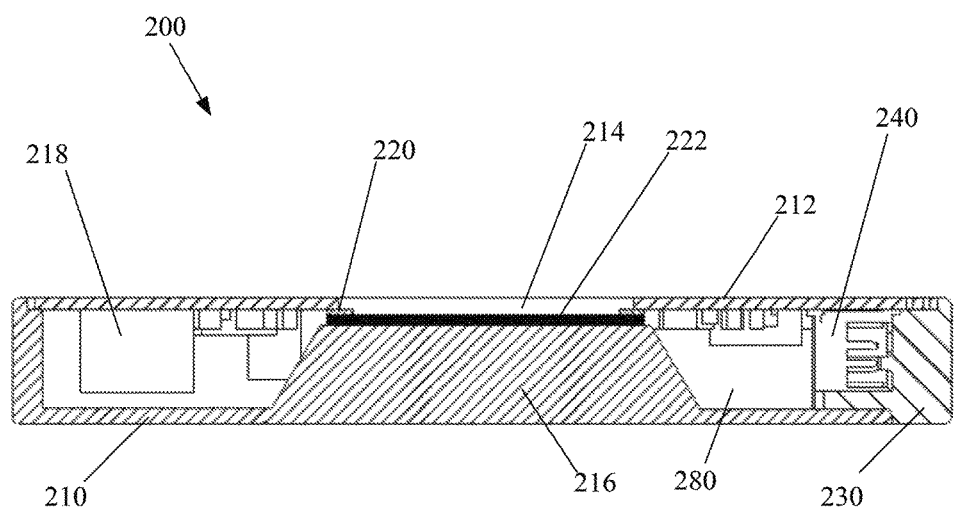
FIG. 2 is a cross sectional view of an embodiment of the lighting assembly.

FIG. 2 illustrates a cross sectional view of an embodiment of the lighting assembly 200. As shown, FIG. 2 illustrates the assembled components described above with respect to FIG. 1. The lighting assembly 200 includes a housing 210, a substrate 212, a light emitting element 214, a notch 230, an interior 280, an electrical connector 240, and electronic components 218. The housing 210 includes a protrusion 216 that extends up from the housing to support the light emitting element 214. The protrusion 216 also provides a thermal connection to the light emitting element 214 to dissipate heat such that heat dissipated from the light emitting element 214 can be spread throughout the entire housing 210. The housing 210 provides direct dissipation of heat from the light emitting element 210 and may be configured to couple to a heat sink for added heat dissipation.

The light emitting element 214 includes an LED array 222 disposed on a substrate and electrical pads 220. The electrical pads 220 of the light emitting element 214 may electrically couple to the electrical conductors disposed on the first side of the substrate 212 to form an electrical connection with the at least one of the electronic components 218 of the substrate 212. In some embodiments of the lighting assembly, the light emitting element 214 may be coupled to the first or second side of the substrate 212 to form the electrical connection with at least one of the electronic components. The electrical connections described above may be formed by conductive traces or wires that form a conductive path to at least one of the electrical components from the light emitting element 214. Moreover, the electrical conductors that couple to the electrical pads 220 may be conductive traces.

As illustrated, the housing 210 is arranged with the substrate 212 to form an enclosure. The enclosure comprises an interior surface. The light emitting element 214 is disposed above the protrusion 216. The protrusion 216 of the housing 210 is thermally coupled to the substrate of the light emitting element 214 in order to cool the light emitting element 214. In some embodiments of the lighting assembly, the area between the substrate 212 and the protrusion 216 is filled with a thermally conductive material, such as a thermal paste or thermal grease, for improved cooling of the lighting assembly 200.

As discussed above, the substrate 212 has first and second sides. The electronic components 218 are disposed on the first side of the substrate and the second side of the substrate is flat. As shown in the lighting assembly 200, the enclosure comprises an interior surface comprising the first side of the substrate and an exterior surface comprising the second side of the substrate. The enclosure also comprises the interior 280. The interior 280 comprises the light emitting element 214 arranged within the opening of the substrate 212. The opening of the substrate 212 is similar to the opening 120, discussed with respect to FIG. 1. Light is emitted from the light emitting element 214 though the opening. Light emitted from the light emitting element 214 may be emitted away from the enclosure such that the flat surface 218 reduces optical interference of the emitted light. Such a configuration may be adaptable to incorporate variable optical configurations without interfering with the electronic components on the opposing side of the substrate 212. Moreover, the top surface of the lighting assembly 200 may be sloped or curved around the light emitting element 214 while still providing a surface that reduces or eliminates optical interference from electronic components.

The notch 230 is configured to electrically connect the electrical connector 240 to a remote source.

Figure 3:
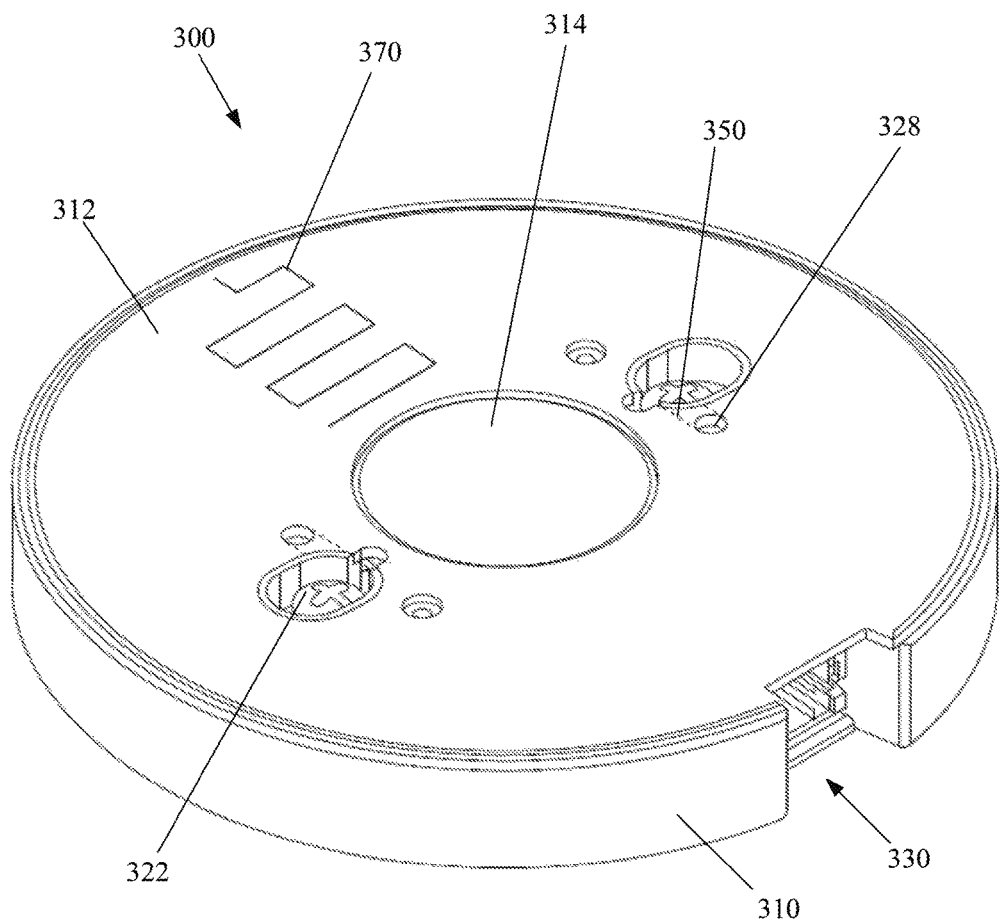
FIG. 3 is an isometric view of an embodiment of the lighting assembly.

FIG. 3 illustrates an isometric view of an embodiment of the lighting assembly. As shown, FIG. 3 includes the lighting assembly 300, a housing 310, a substrate 312, a light emitting element 314, an antenna 370, a notch 330, alignment holes 328, through holes 322 and optional cutout 350. In some embodiments of the substrate, the surface of the substrate may be made of a reflective material.

The through holes 322 are positioned on top of the lighting assembly 300. As discussed above, the light emitting element 314 is arranged in an opening in the substrate 312. The illustrated surface, or second surface, of the substrate 312 is flat allowing for a reduction in optical interference with the light emitted from the light emitting element 314. The dimensions of the lighting assembly as well as mounting hole placement are variable to improve optic component compatibility. Moreover, those of ordinary skill in the art will recognize that the substrate may have any suitable surface geometry without departing from the scope of the invention. For instance, the substrate may have at least one step, a linear slop, or a parabolic slope about the centered light emitting element 314. Such geometries still allow for light emission from the light emitting element 314 that is not obstructed by any electrical components.

The through holes 322 are configured to couple the enclosed lighting assembly 300 to a third party element such as a heat sink or a wall.

The alignment holes 328 may assist to properly align the substrate 312 to the proper position in order to form the enclosed lighting assembly 300. In some embodiments of the lighting assembly, the opening 322 of the substrate 312 may optionally include an extension 350 that surrounds the alignment holes 328. In such embodiments, the alignment holes 328 may extend to be flush with the top of the housing. The substrate opening around the through holes 322 and extension 350 may then surround the extended portion of the alignment hole (328 and 350). Fasteners may be inserted in the through holes 322 to secure the lighting assemble 300 to a third party apparatus such as a heat sink. Reflective removable covers, each positioned on the exposed (second) surface of the substrate 312 may cover different ones of the fasteners inserted in the through holes 322. Additionally, an optical element may be attached to the substrate by way of the fasteners. The Optical element may be used for directing light emitted from the light emitting element.

The lighting assembly 300 may also include an antenna 370 disposed on the exposed, second surface of the substrate 312. The antenna 370 is disposed on the second surface of the substrate 312 opposite the electronic components disposed on the first side of the substrate 312. The antenna 370 may be coupled to at least one of the electronic components on the first side of the substrate 312. The antenna 370 may be used to receive wireless signals that control the light emitted from the lighting assembly 300. In some embodiments of the lighting assembly, the antenna is a trace antenna.

Figure 4:
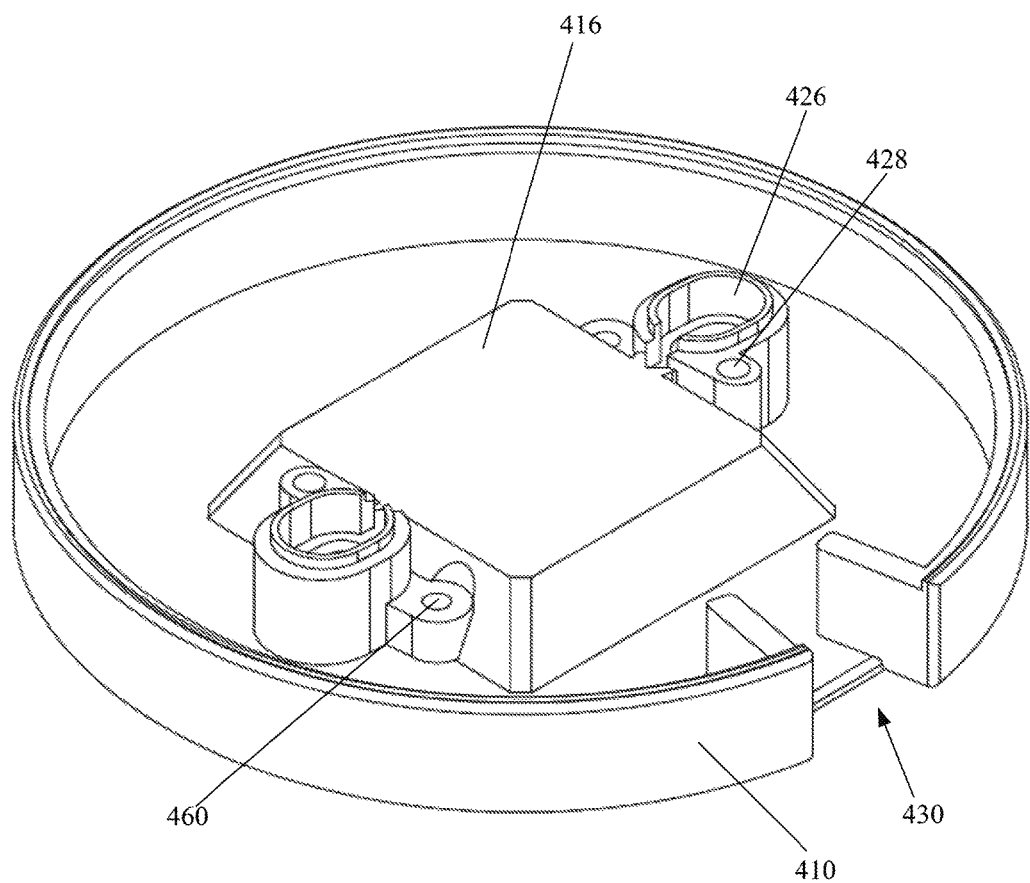
FIG. 4 is an isometric view of the lower portion of an embodiment of the housing showing a protrusion.

FIG. 4 illustrates an isometric view of the housing 410. As shown, the housing 410 includes a protrusion 416, openings 426, alignment holes 428, through holes 460, and a notch 430. The openings 426 include through holes such as through holes 322 discussed with respect to FIG. 3 for attaching an optical element and/or a heat sink to the housing.

The protrusion 416 can be any one of a pyramid, conical, or cylindrical shape formed as part of the housing 410. The protrusion 416 may be formed in the center of the housing 410. In some embodiments of the housing 410, the protrusion 416 and the housing 410 may be made of die cast aluminum. In other embodiments of the housing, the protrusion 416 and the housing 410 may be made using metal injection molding. The openings 426 are disposed adjacent to the protrusion 416 but are securely attached and made of the same material. Alternatively, the openings 426 may be made as part of the protrusion 416. Since the protursion 416 may be made of a rigid material such as aluminum or metal, the openings 426 are also made of a rigid material, which is anchored together with the protrusion. By attaching an optical element (not shown) directly to the portrusion 416 via openings 426, the optical element is rigidly and/or securely fastened to the enclosure. Alignment holes 428 may be used to align the housing 410 and a substrate such as the substrate 312 described with respect to FIG. 3. When the housing 410 is aligned with a substrate, a thermal connection between the protusion 416 and a light emitting element, such as the light emitting element 314 described with respect to FIG. 3, is formed. As discussed in the following figure, fasteners such as screws may be used to attach the housing 410 to threaded nuts in the substrate via the through holes 460.

The notch 430 is an opening for inserting wiring into the enclosure formed by the housing 410 and a substrate such as the substrate 312 described in FIG. 3. The notch 430 can be configured to run the wiring in a plurality of directions. The wiring may electrically couple to an electrical connector such as the electrical connector 240 as described in FIG. 2. The notch 430 is configured to electrically connect the electronic components described in the above figures to a remote source.

Figure 5:
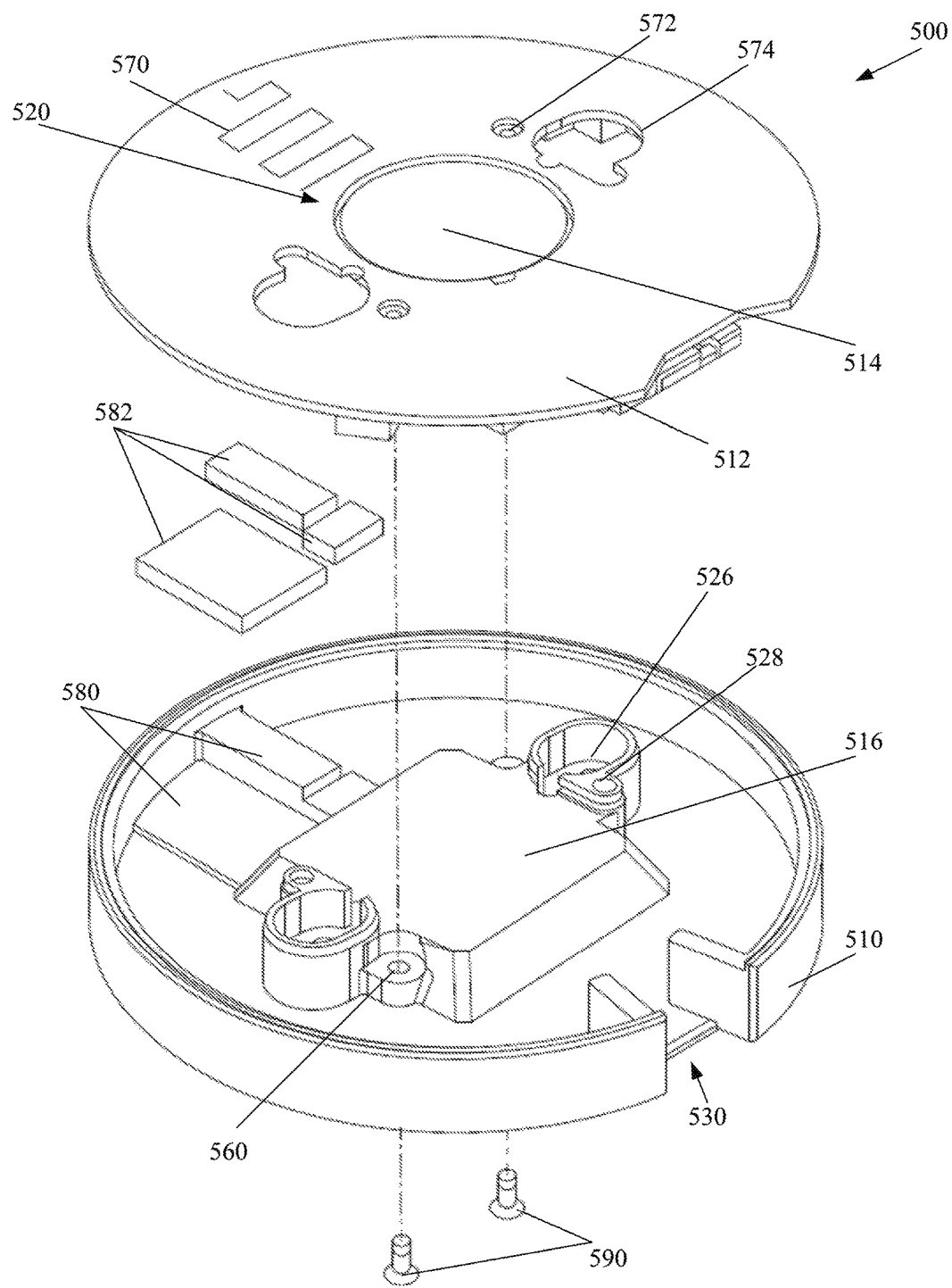
FIG. 5 is an exploded perspective view of an embodiment of the lighting assembly including standoffs and gap pads.

FIG. 5 illustrates an exploded perspective view of an embodiment of the lighting assembly 500 including standoffs and gap pads. As shown, the lighting assembly 500 includes a substrate 512, a housing 510, contacts 520, a light emitting element 514, threaded nuts 572, substrate alignment holes 574, an antenna 570, gap pads 582, standoffs 580, alignment holes 526 and 528, protrusion 516, through holes 560, a notch 530, and fasteners 590. The substrate 512, the contacts 520, the light emitting element 514, to alignment hole 574, the trace antenna 570, the alignment holes 526 and 528, the protrusion 516, and the notch 530 have already been described in detail above in connection with FIGS. 1-4. As shown, the substrate 512 may be fitted with the electronic components facing away from the light emitting element 514. The electronic components and contacts 520 may be positioned on the first side of the substrate 512. The antenna 570 may be positioned on the second side of the substrate 512. The substrate 512 may be arranged with the housing 510 to form an enclosure by using the fasteners 590 that pass through the through holes 560 and are screwed into the threaded nuts 572 which are affixed to the first side of the substrate 512. In some embodiments of the lighting assembly the threaded nuts are soldered to the substrate 512 on the same side as the electronic components. Thus, the electronic components and the threaded nuts may be assembled on the substrate at the same time without manual intervention.

In some embodiments of the lighting assembly, the fasteners 590 may be threaded screws. However, any suitable means for fastening the substrate 512 to the housing 510 may be utilized.

When the substrate 512 is arranged with the housing 510, the light emitting element fits in the opening of the substrate forming an electrical connection with the conductors 520 disposed on the first side of the substrate 512. Additionally, a thermal coupling is formed between the light emitting element 514 and the protrusion 516.

Certain electronic components that are not in contact with the protrusion 516 may have additional cooling requirements. The gap pads 582 may be used to provide a thermal coupling between the electronic component and the housing 510 to dissipate heat from the electronic component. For instance, when an electronic component is positioned in close proximity from the base of the housing 510, a gap pad 582 may be placed between the base of the housing and the electrical component. A gap pad is a thermally conductive malleable material that may also be electrically insulating. The gap pad thermally couples the electrical component to the housing 510.

In certain circumstances, an electronic component in need of additional cooling may not be close enough to the base of the housing 510. In such circumstances, the standoff 580 made of the same material as the protrusion 516 and housing 510 may be built arranged within the housing 510. The gap pads 582 may be disposed over the standoffs 580 to provide a thermal coupling between the electronic component and the stand-off arranged in the housing to cool the electronic component. The standoffs 580 thermally couple the gap pads 582 to the housing.

Figure 6:
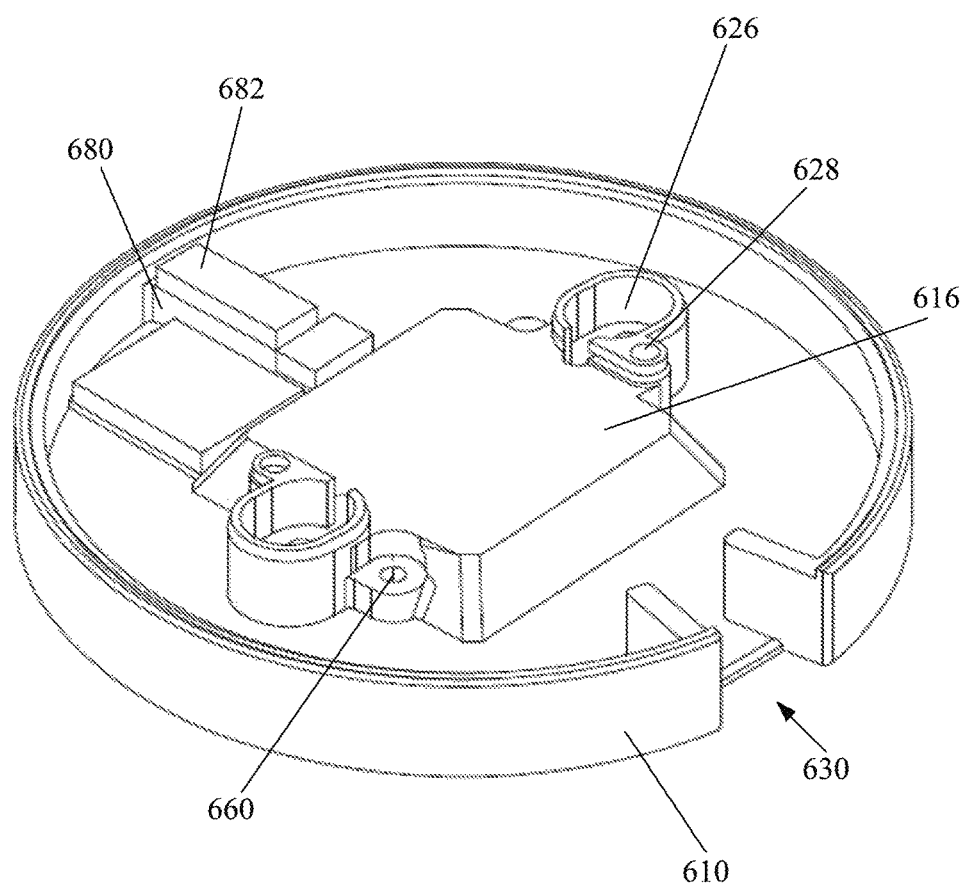
FIG. 6 is an isometric view of the housing showing standoffs and gap pads.

FIG. 6 is an isometric view of the housing 610 showing standoffs and gap pads. The housing of FIG. 6 may be similar to the housing 510 illustrated in FIG. 5. The housing 610 includes alignment holes 626 and 628, protrusion 616, notch 630, through holes 660, standoffs 680, and gap pads 682. In some embodiments of the lighting assembly, all of the elements illustrated in the FIG. 6 may be made of the same single piece of metal. The notch 630, the alignment holes 626 and 628, and the protrusion 616 have all been described in detail above in connection with FIGS. 1-5. As shown in FIG. 6, the gap pads 682 are disposed on the standoffs 680. As discussed above, this configuration provides additional cooling to electronic components on the substrate that may have additional cooling needs. When the components are short, the standoffs may be used to reach the electronic component to provide adequate thermal conductivity by way of the gap pad 682. Similar to the protrusion 616, the standoff support electronic components and/or provide a mechanism to dissipate heat such that heat is spread throughout the entire housing 610.

Figure 7:
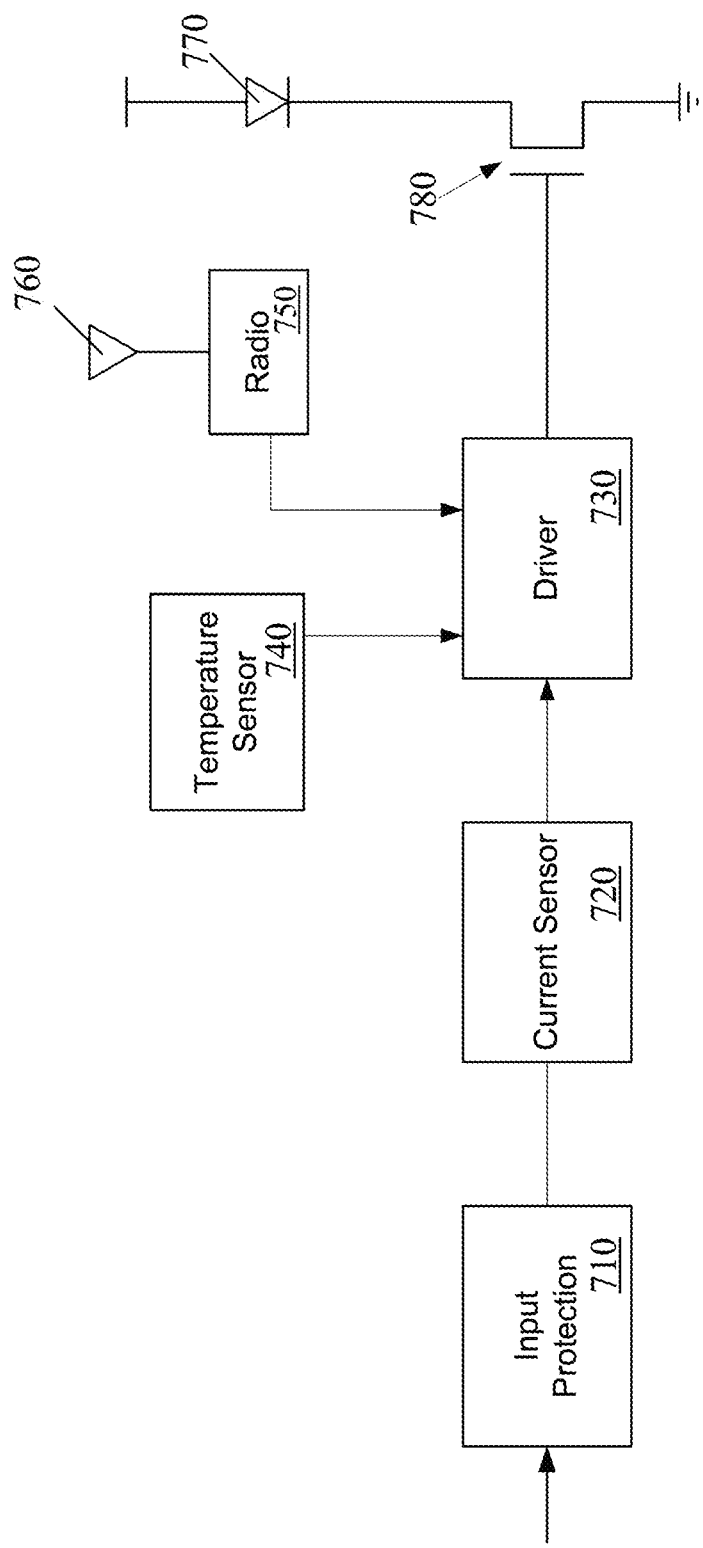
FIG. 7 is an exemplary embodiment of a circuit diagram of electronic components that can be incorporated into a PCBA used in an embodiment of the lighting assembly.

FIG. 7 is an exemplary circuit diagram of electronic components 118 that can be incorporated into a PCBA such as the substrate 112 used in the lighting assembly in accordance with another embodiment. As shown, the circuit diagram includes an input protection circuit 710, a current sensor circuit 720, an LED driver circuit 730, a temperature sensor 740, a radio 750, an antenna 760, an LED 770, and a transistor 780. In some embodiments of the circuit, the LED 770 may be an array of series and/or parallel connected LEDs. The LED array may be included in the light emitting element described above. The output from LED runs to ground through the transistor 780.

The input protection circuit 710 regulates the input voltage and transmits a regulated voltage to the current sensor circuit 720. The current sensor circuit 720 measures a differential voltage by measuring the voltage drop across a resistor in the current sensor circuit. The current sensor circuit 720 then transmits a signal to the LED Driver 730. The LED Driver 730 controls the gate of transistor 780, which controls the brightness of the LED 770. The LED driver may modulate a pulse width, which drives the transistor 780. More current is flows to the LED 770 when the duty cycle is higher. In some embodiments of the circuit, the transistor 780 may be a FET.

The temperature sensor 740 measures the temperature of the light emitting element and/or electronic components on the substrate. The temperature sensor 740 transmits a signal based on the measured temperature to the LED Driver 730, which can then modulate transistor 780 according to the received temperature sensor signal. For instance, if the measured temperature is above a threshold value, the temperature sensor 740 may transmit a signal to limit the light output. In such instances, the LED Driver 730 will send a signal to the transistor 780 to decrease current to the LED 770, thereby reducing the light output from the LED 770.

The circuit illustrated in FIG. 7 also includes a remote on/off control using signals received at the antenna 760. The antenna 760 may be similar to the trace antenna 370 illustrated in FIG. 3. Any wireless signals received by the antenna 760 are transmitted to the radio 750. The radio 750 may perform an analog to digital conversion of the received signal. The radio 750 may then transmit a signal to the LED Driver 730 to turn the transistor 780 on or off or to control the brightness of LED 770 to a specific value.

The Antenna 760 may receive a signal from a variety of electronic devices over a variety of different wireless protocols such as 802.11, Bluetooth, ZigBee, 802.15.4, Near Field Communication (NFC), cellular transmission or any other suitable wireless protocol. Some embodiments of the circuit may convert the transmission in a module separate from the radio 750. The circuit described in FIG. 7 illustrates a subset of the electronic components on the substrate described above that fits within the enclosure of the lighting assembly.

Figure 8A:
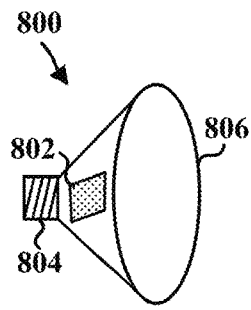
FIGS. 8a-c are side view illustrations of various exemplary apparatuses having a lighting assembly.

FIG. 8a is a side view illustration of an exemplary lamp 800 having a lighting assembly 802. Lamp 800 may be used for any type of general illumination. For example, lamp 800 may be used in an automobile headlamp, street light, overhead light, or in any other general illumination application. The lighting assembly 802 may be located in a housing 806. The lighting assembly 802 may receive power via a power connection 804. As discussed above, the lighting assembly 802 may receive 110V of power or 220V of power and still operate normally. The lighting assembly 802 may be configured to emit light. Description pertaining to the process by which light is emitted by the lighting assembly 802 is provided with reference to FIGS. 1-4.

Figure 8B:
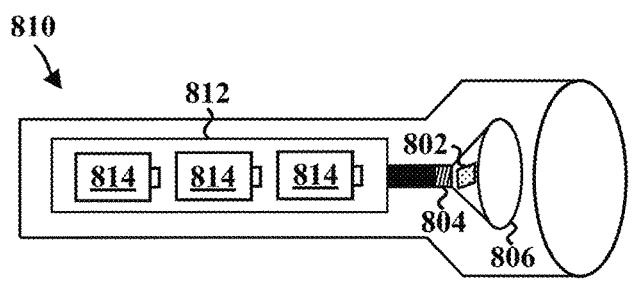

FIG. 8b is a side view illustration of a flashlight 810, which is an exemplary embodiment of an apparatus having the lighting assembly 802. The lighting assembly 802 may be located inside of the housing 806. The flashlight 810 may include a power source. In some aspects of the lighting assembly, the power source may include batteries 814 located inside of a battery enclosure 812. In another aspect of the lighting assembly, power source 810 may be any other suitable type of power source, such as a solar cell. The power connection 804 may transfer power from the power source (e.g., the batteries 814) to the lighting assembly 802.

Figure 8C:
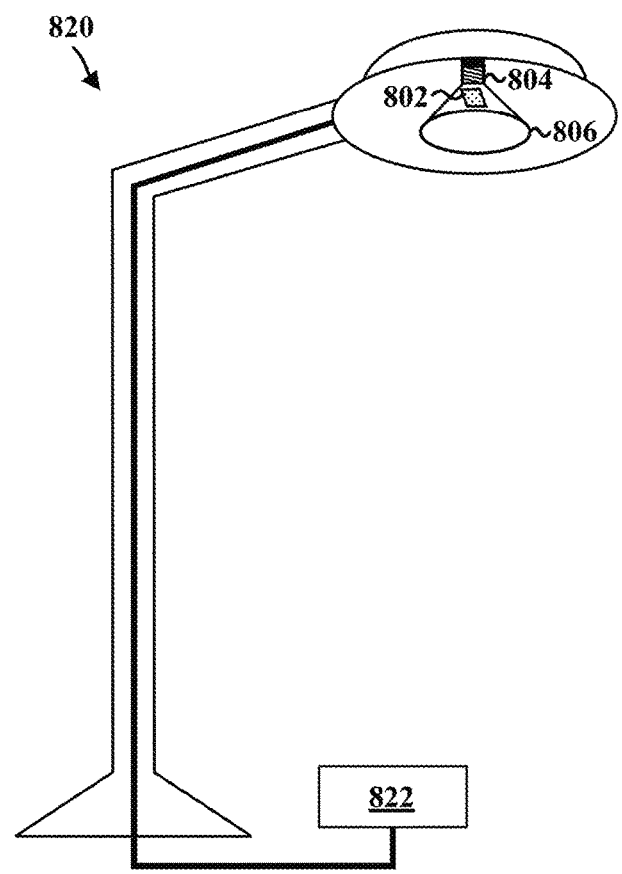

FIG. 8c is a side view illustration of a street light 820, which is another exemplary embodiment of an apparatus having the lighting assembly 802. The lighting assembly 802 may be located inside of the housing 806. The street light 820 may include a power source. In some exemplary embodiments, the power source may include a power generator 822. The power connection 804 may transfer power from the power source (e.g., the power generator 822) to the lighting assembly 802.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other circuits. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A lighting assembly comprising:
    a substrate comprising a first side, a second side and an opening, wherein the second side of the substrate is an exterior surface of the lighting assembly;
    a plurality of electronic components disposed on the first side of the substrate, the plurality of electronic components comprising a transistor;
    a light emitting element attached to the first side of the substrate and positioned within the opening of the substrate; and
    an antenna disposed on the second surface of the substrate.

2. The lighting assembly of claim 1, wherein the plurality of electronic components are potted.

3. The lighting assembly of claim 1, wherein the second side of the substrate is configured to attach to an optical element for directing light emitted from the light emitting element.

4. The lighting assembly of claim 1, wherein the plurality of electronic components further comprise an input protection circuit.

5. The lighting assembly of claim 1, wherein the lighting emitting element comprises an LED array, and wherein the plurality of electronic components further comprise a LED driver circuit.

6. A lighting assembly comprising:
    a substrate comprising a first side, a second side and an opening, wherein the first side of the substrate is a circuit board assembly, wherein the second side of the substrate is an exterior surface of the lighting assembly;
    a light emitting element attached to the substrate and positioned within the opening of the substrate; and
    a housing configured to thermally couple to the light emitting element, the housing comprising:
        a protrusion;
        a plurality of alignment holes disposed adjacent to the protrusion, the plurality of alignment holes for aligning the substrate to the housing, and
        at least one through hole configured to couple the housing to an external heat sink.

7. The lighting assembly of claim 6, wherein the housing and the first side of the substrate form an enclosure having an interior space.

8. The lighting assembly of claim 6, further comprising an optical element coupled to the housing.

9. The lighting assembly of claim 6 further comprising a plurality of electronic components disposed on the first side of the substrate.

10. The lighting assembly of claim 9, wherein the plurality of electronic components comprise a transistor.

11. The lighting assembly of claim 9, wherein the plurality of electronic components comprise an input protection circuit.

12. The lighting assembly of claim 6, wherein the lighting emitting element comprises an LED array.

13. The lighting assembly of claim 12 further comprising a plurality of electronic components disposed on the first side of the substrate, and wherein the plurality of electronic components comprise a LED driver circuit.

* * * * *